United States Patent [19]

Bergemont

[11] Patent Number: 5,240,870
[45] Date of Patent: Aug. 31, 1993

[54] STACKED GATE PROCESS FLOW FOR CROSS-POINT EPROM WITH INTERNAL ACCESS TRANSISTOR

[75] Inventor: Albert M. Bergemont, San Jose, Calif.

[73] Assignee: National Semiconductor Corporation, Santa Clara, Calif.

[21] Appl. No.: 912,021

[22] Filed: Jul. 9, 1992

Related U.S. Application Data

[63] Continuation of Ser. No. 799,762, Apr. 13, 1992, abandoned, which is a continuation of Ser. No. 687,176, Apr. 18, 1991, abandoned.

[51] Int. Cl.$^5$ ............... H01L 21/266; H01L 21/76
[52] U.S. Cl. ........................ 437/43; 437/49; 437/979; 437/985
[58] Field of Search ............ 437/42, 43, 49, 52, 437/195, 915, 979, 984, 985

[56] References Cited

U.S. PATENT DOCUMENTS

| | | | |
|---|---|---|---|
| 4,795,719 | 1/1989 | Eitan | 437/43 |
| 4,833,514 | 5/1989 | Esquivel et al. | 437/43 |
| 4,849,369 | 7/1989 | Jeuch et al. | 437/49 |
| 4,851,365 | 7/1989 | Jeuch | 437/43 |
| 4,861,730 | 8/1989 | Hsia et al. | 437/43 |
| 4,892,840 | 1/1990 | Esquivel et al. | 437/52 |
| 5,013,674 | 5/1991 | Bergemont | 437/49 |
| 5,028,553 | 7/1991 | Esquivel et al. | 437/43 |

OTHER PUBLICATIONS

Yosiaki S. Hisamune, et al.; A 3.6 $\mu m^2$ Memory Cell Structure for 16Mb EPROMS; IEEE 1989; Jul. 1989, pp. 583–586.

A. Bergemont, et al.; A High Performance CMOS Process for Submicron 16 Mb EPROM; IEEE 1989; Jul. 1989 pp. 591–594.

Yoichi Ohshima et al.; Process and Device Technologies for 16Mbit EPROMs with Large-Tilt-Angle Implanted P-Pocket Cell; IEEE 1990; Apr. 1990 pp. 95–98.

Primary Examiner—Tom Thomas
Assistant Examiner—C. Chaudhari
Attorney, Agent, or Firm—Limbach & Limbach

[57] ABSTRACT

Two process flows are disclosed for the stacked etch fabrication of an EPROM array that utilizes cross-point cells with internal access transistors. In each process flow, the edges of the poly 1 floating gates parallel to the poly 2 word line are self-aligned to the word line, eliminating parasitic poly 2 transistors and process requirements for coping with such transistors.

10 Claims, 12 Drawing Sheets

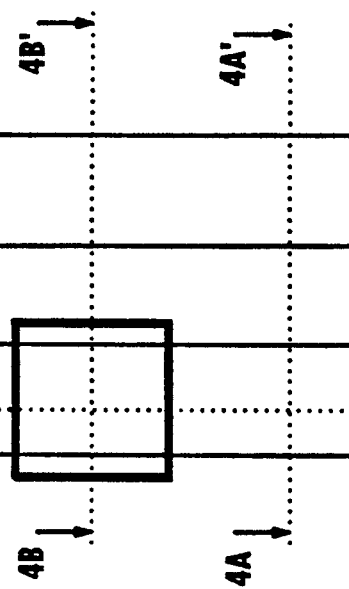
FIG. 4
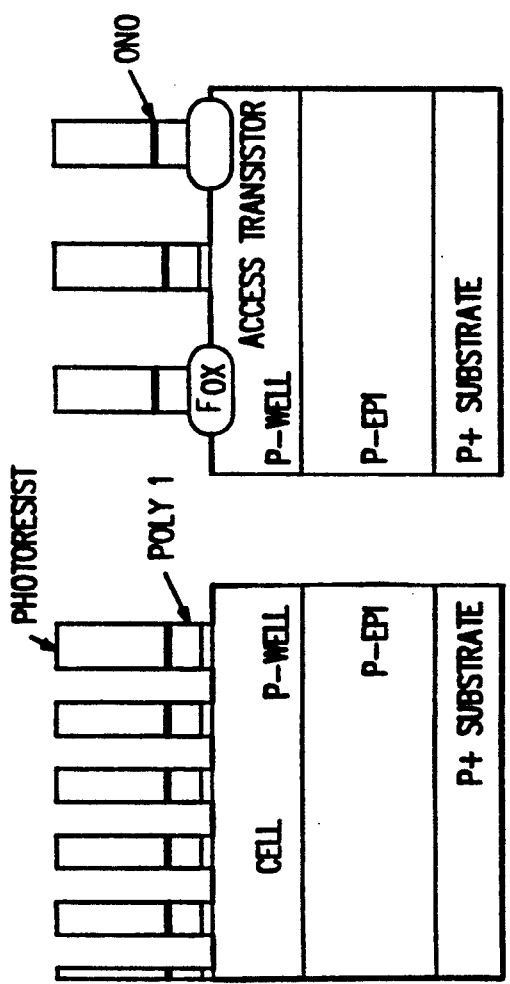
FIG. 4A/A'
FIG. 4B/B'
FIG. 4C/C'

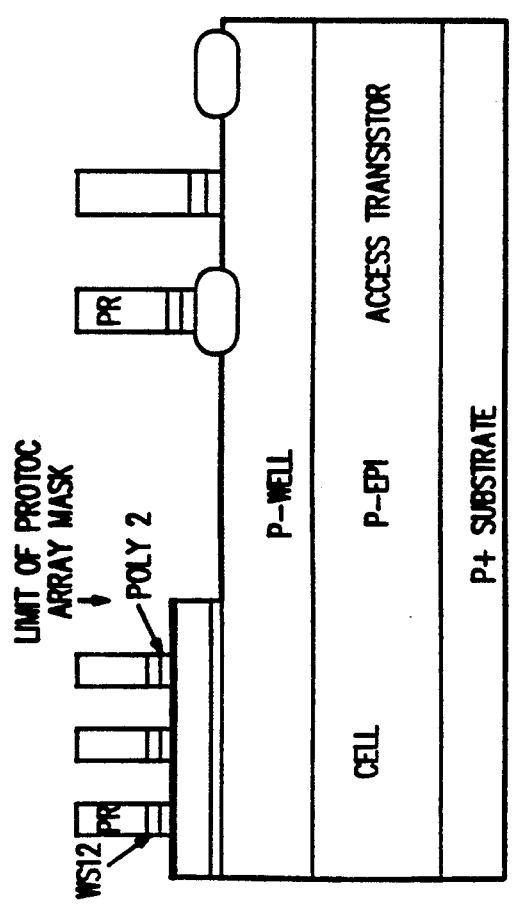
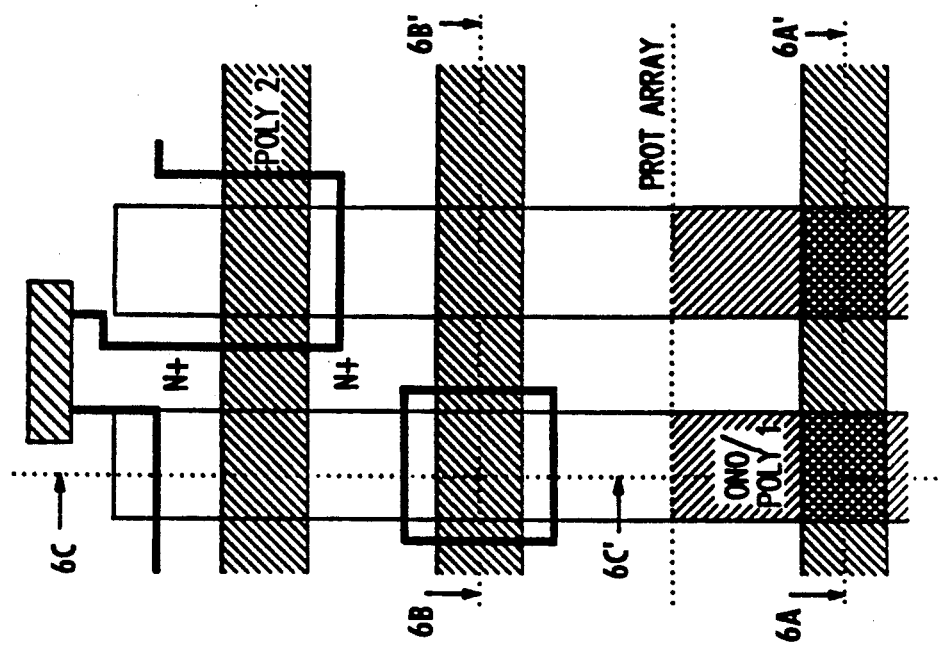
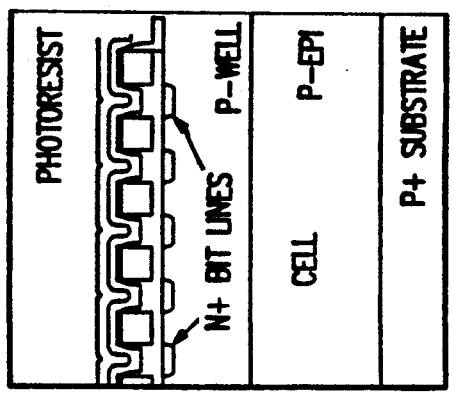
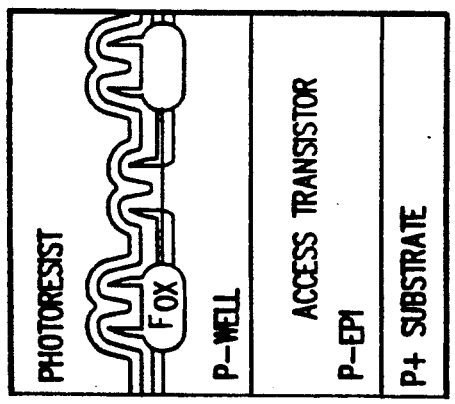
FIG. 6A/A'
FIG. 6B/B'
FIG. 6C/C'
FIG. 6

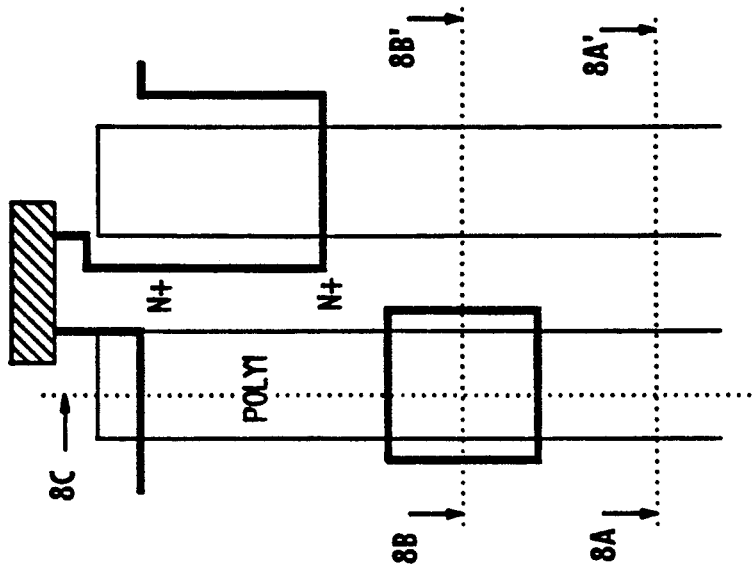
FIG. 8
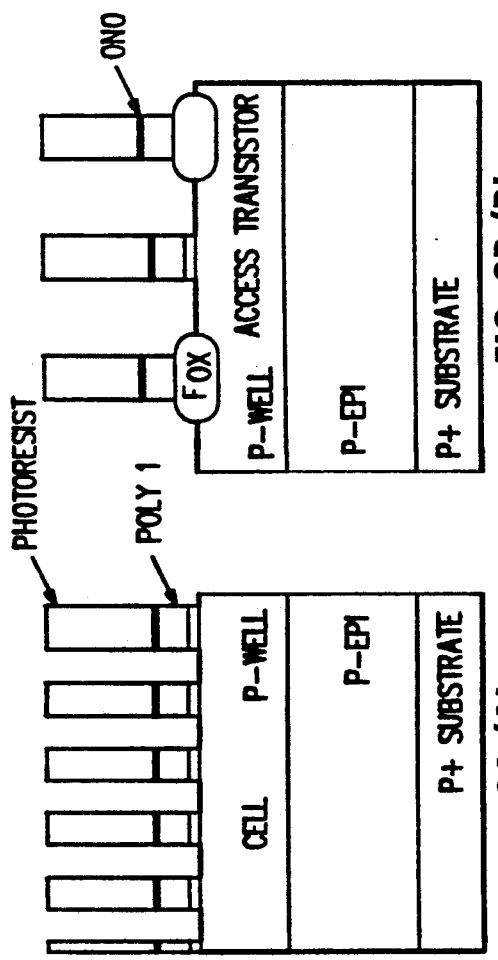
FIG. 8A/A'
FIG. 8B/B'
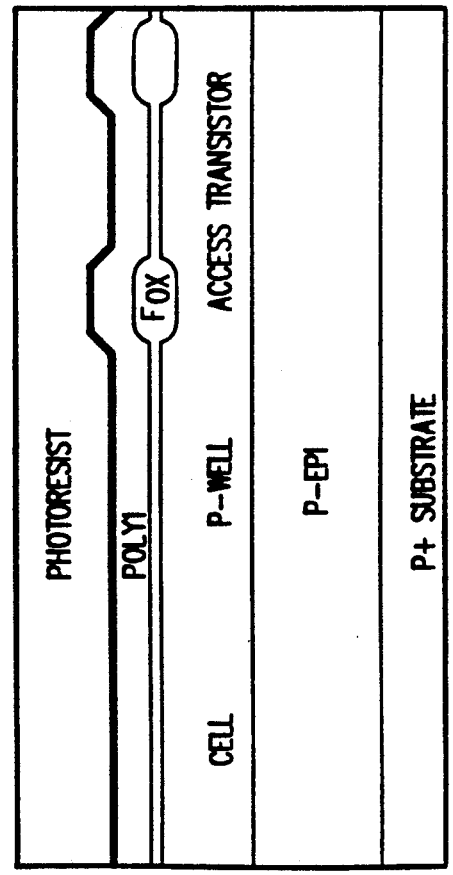
FIG. 8C/C'

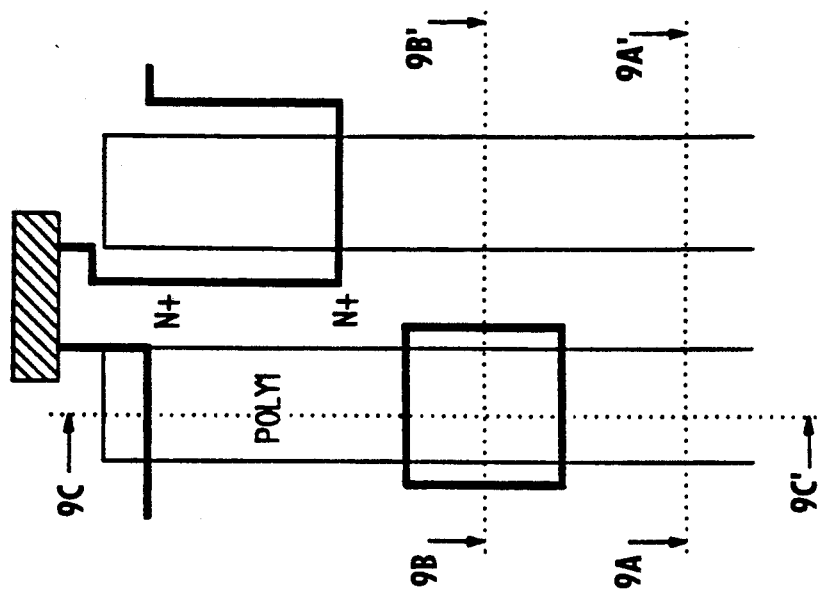
FIG. 9
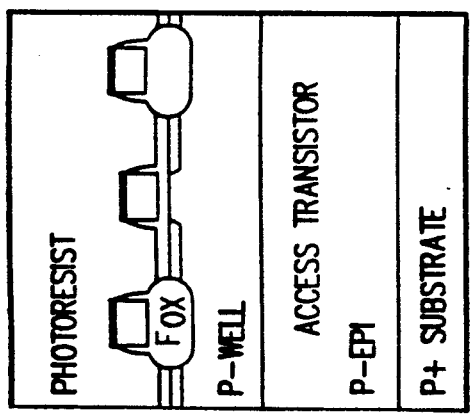
FIG. 9B/B'
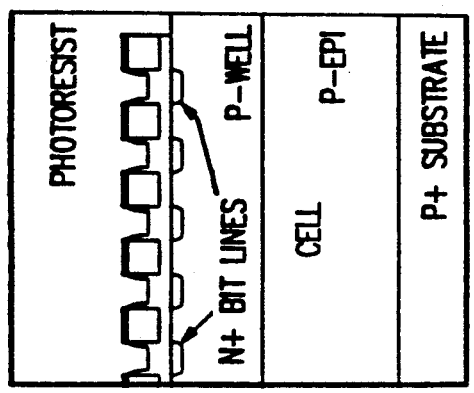
FIG. 9A/A'
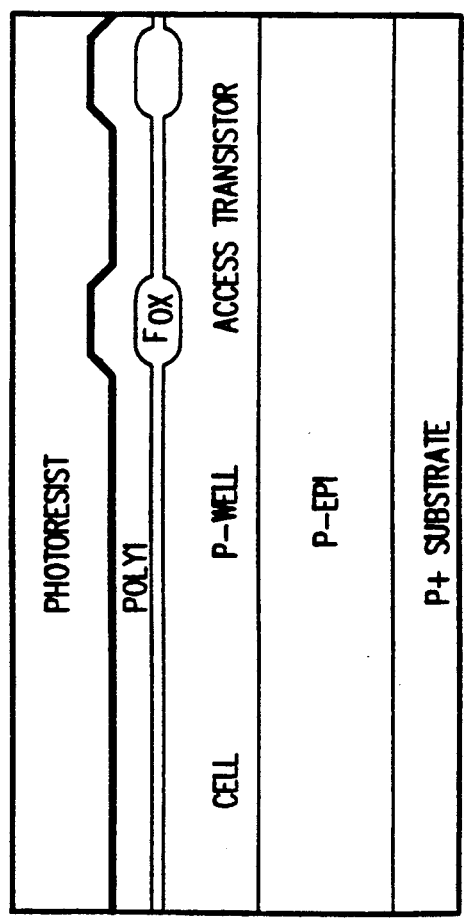
FIG. 9C/C'

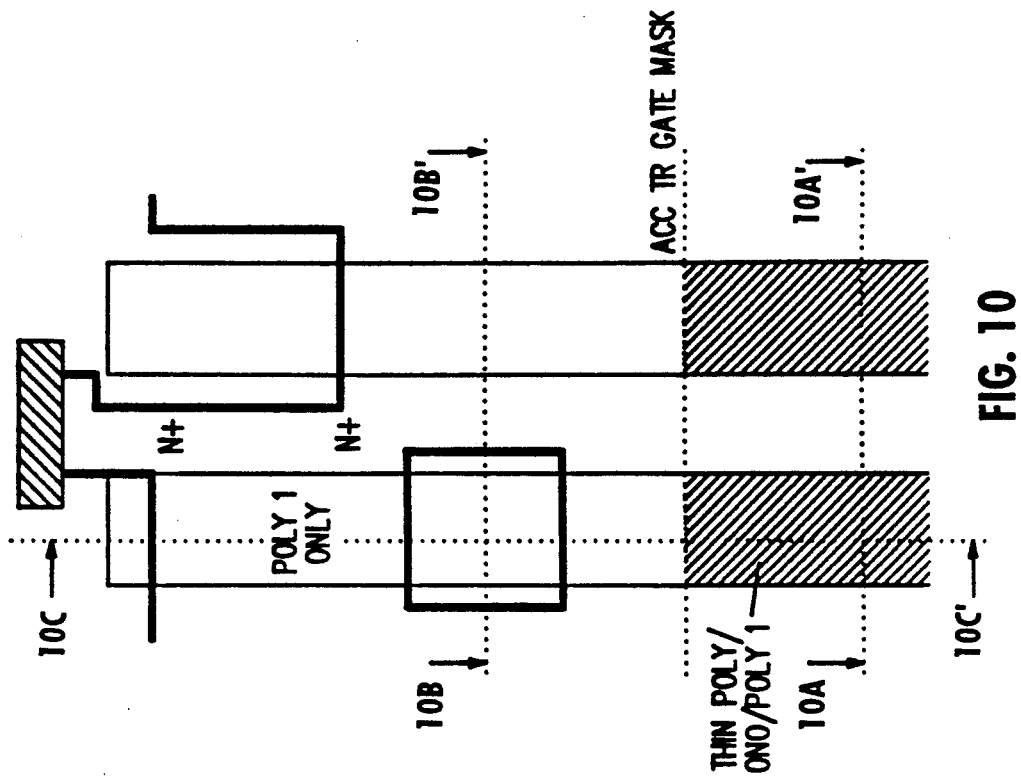
FIG. 10
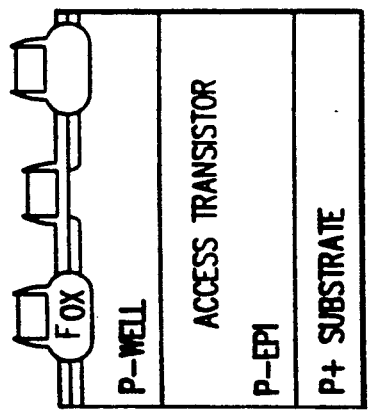
FIG. 10A/A'
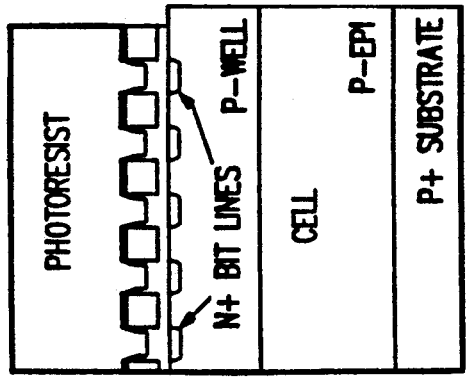
FIG. 10B/B'
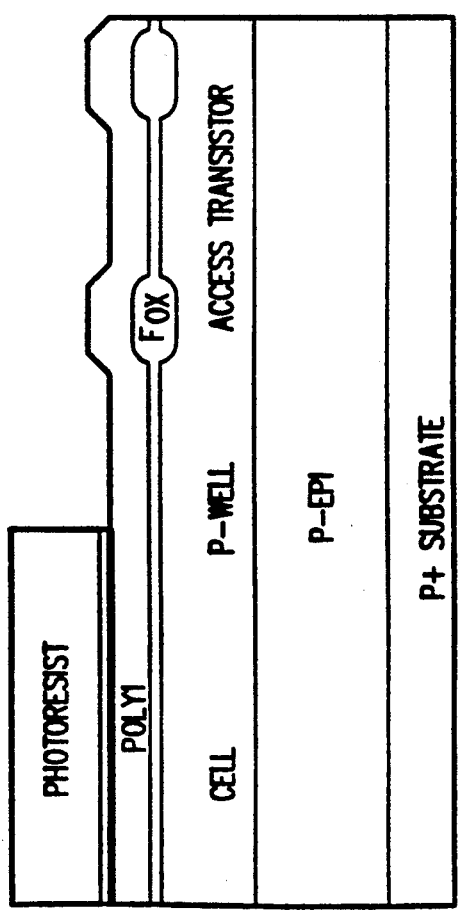
FIG. 10C/C'

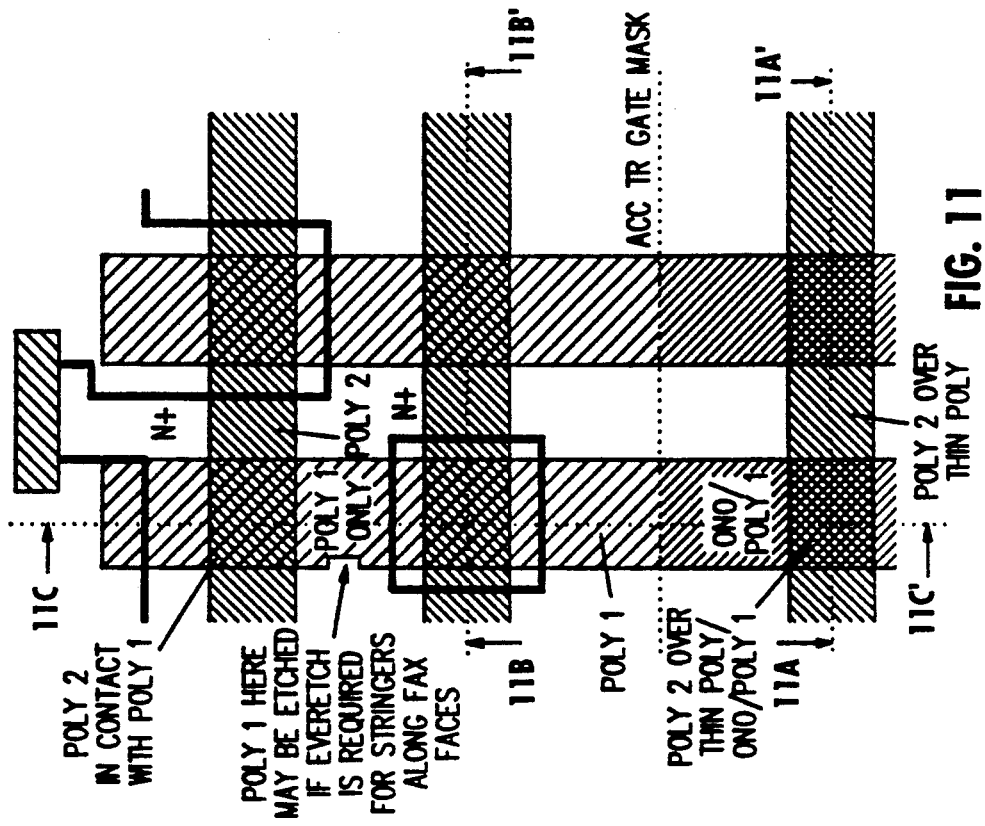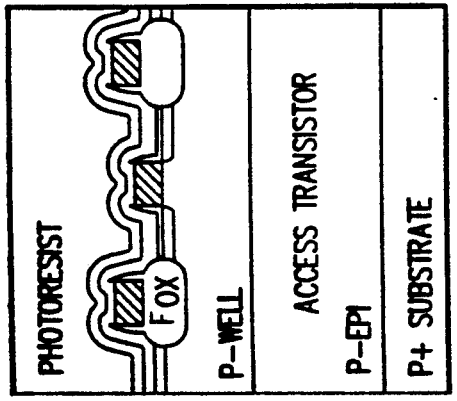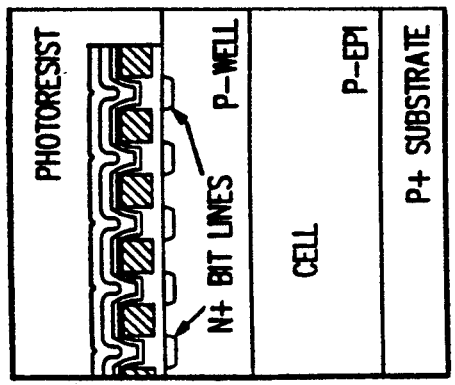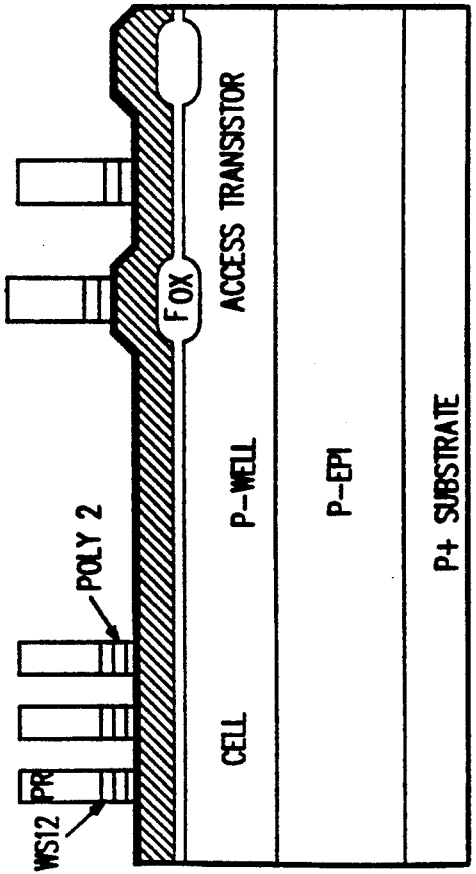
FIG. 11
FIG. 11B/B'
FIG. 11A/A'
FIG. 11C/C'

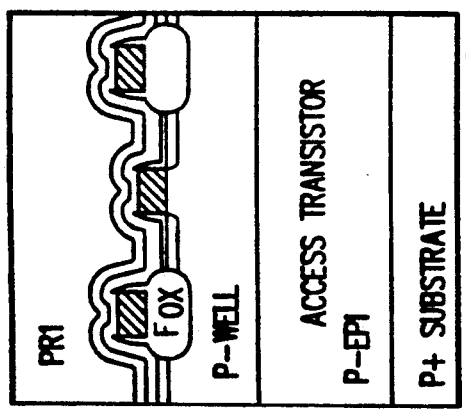
FIG. 12A/A'
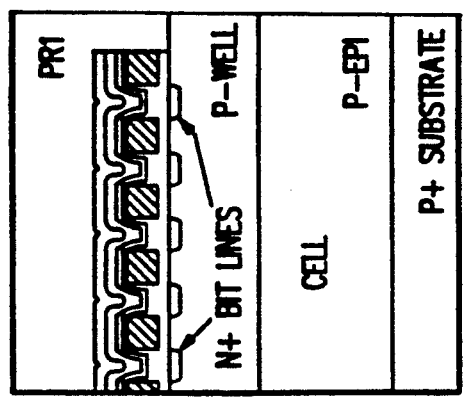
FIG. 12B/B'
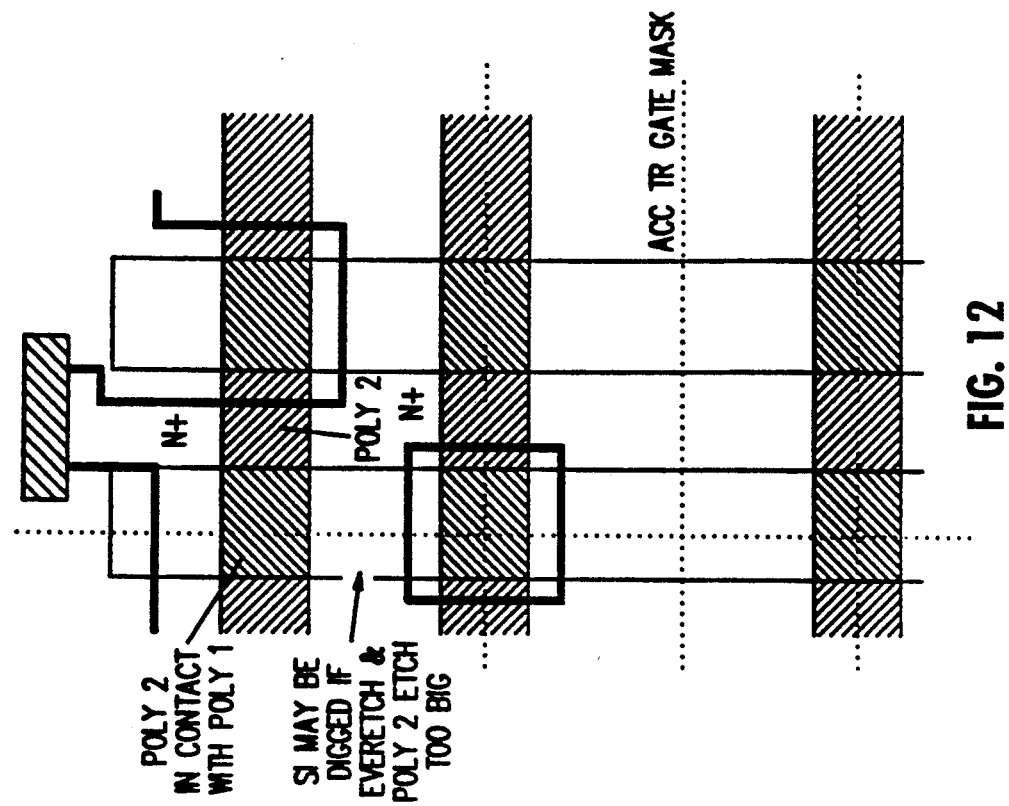
FIG. 12
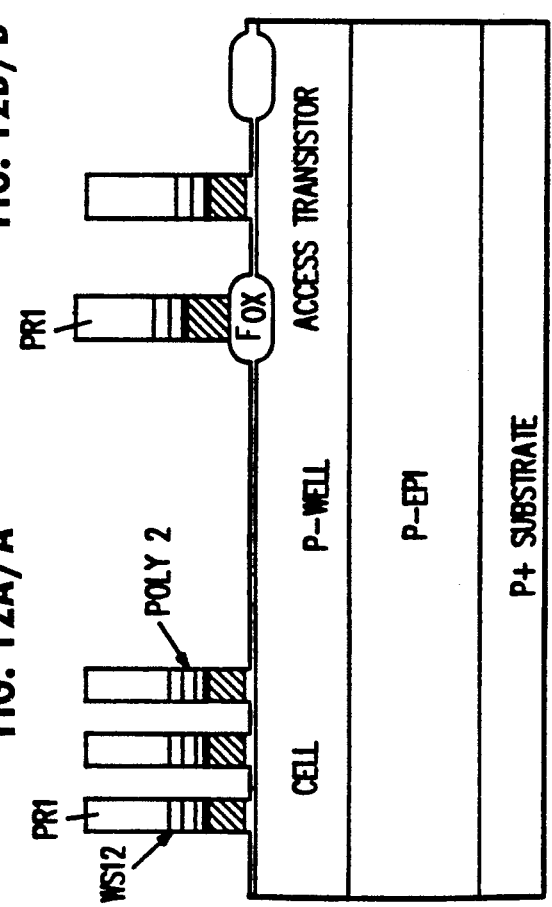
FIG. 12C/C'

STACKED GATE PROCESS FLOW FOR CROSS-POINT EPROM WITH INTERNAL ACCESS TRANSISTOR

This is a continuation of co-pending application Ser. No. 07/799,762 filed on Apr. 13, 1992, now abandoned, which is a continuation of prior application Ser. No. 07/687,176, filed on Apr. 18. 1991, now abandoned.

BACKGROUND OF THE INVENTION

1. Field of the Invention

The present invention relates to electrically programmable read only memory (EPROM) devices and, in particular, to a process for fabricating a stacked etch, contactless EPROM array that utilizes cross-point cells and internal access transistors.

2. Discussion of the Prior Art

An electrically programmable read only memory (EPROM) device as a non-volatile memory integrated circuit which is used to store binary data. Power can be removed from an EPROM without loss of data. That is, upon reapplying power, the originally stored binary data is retained.

In addition to its data retention capability, an EPROM can also be programmed to store new binary data. Reprogramming is accomplished by first exposing the EPROM to an ultra-violet (UV) light source in order to erase the old binary data. A UV-transparent lid on the packaged EPROM chip allows this erasure to occur. Following erasure, the new binary data is written to the EPROM by deactivating the chip select line in order to switch the EPROM data outputs to inputs. The EPROM address inputs are then set to a starting value, the desired data is connected to the data inputs and the data is written into the data storage register identified by the address inputs. The address inputs are then incremented and the cycle is repeated for each data storage register in the EPROM array.

In an EPROM read operation, the binary data stored in the data storage register identified at the address inputs is connected to the EPROM's data output buffers. If the EPROM chip select signal is activated, then the binary data from the selected storage register is provided to the databus.

FIG. 1A shows a conventional EPROM cell 10. EPROM cell 10 includes a buried N+ source region 12 and a buried N+ drain region 14 formed in a P-type silicon substrate 16 and separated by a substrate channel region 18. Overlying channel region 18 is a layer of insulating material 20, typically silicon dioxide. A polysilicon (poly 1) floating gate 22 is formed on the insulating material 20. Overlying floating gate 22 is a second layer 24 of insulating material, usually a composite layer of oxide-nitride-oxide (ONO). A polysilicon (poly 2) control gate 26 is formed on the ONO layer 24.

A plan view of this so-called "stacked gate" (or "stacked etch") EPROM cell 10 is shown in FIG. 1B. The structure of the standard "T-shaped" cell 10 shown in FIG. 1B derives its "stacked-gate" designation because of the self-aligned etching process which utilizes the vertical alignment of the poly 2 control gate 26 with the poly 1 floating gate 22 to complete the definition of the floating gate 22.

The processing sequence for defining the poly 1 floating gate 22 and the poly 2 control gate line 26 of the stacked gate cell 10 is as follows. Referring to FIG. 1A, first, a layer of polysilicon (poly 1) is formed on the silicon dioxide layer 20. The poly 1 layer and is then masked and etched to form poly 1 strips. The edges of the poly 1 strips are then utilized in a self-aligned arsenic implant step to formed the buried N+ source and drain regions 12 and 14, respectively. Next, an oxide-nitride-oxide (ONO) layer 24 is formed over the entire structure. This is followed by formation of a second polysilicon layer (poly 2) which is masked and etched to form the control gate line 26. The resulting poly 2 control gate line 26 is then used as a self-aligned mask to etch the interpoly ONO 24 and the underlying poly 1 floating gate 22 to define the final structure of the stacked gate cell 10 shown in FIG. 1A.

Traditionally, reductions in EPROM memory density have been accomplished by reducing the dimensions of the cell features produced by the photolithographic and etching procedures utilized in fabricating standard T-shaped EPROM cells. The shrinking cell geometries resulting from these process developments have led to corresponding requirements for new isolation schemes in order to accommodate the minimum cell pitch and to develop the sub-micron contacts which must be formed utilizing non-standard techniques.

For example, Hisamune et al, "A 3.6 nm$^2$ Memory Cell Structure for 16 mb EPROMs, IEDM 1989, pg. 583, disclose a process for minimizing EPROM cell pitch utilizing trench isolation of the bit lines and tungsten plugs for bit line contacts. Bergemont et al, "A High Performance CMOS Process for Sub-micron 16 mv EPROM", IEDM 1989, page 591, also disclosed techniques for reducing the size of the standard T-shaped EPROM cell.

One way to avoid the special processing requirements associated with the fabrication of high density T-shaped EPROM cell arrays is to use a different type of cell which does not require the use of field oxide isolation and contacts in the array.

For example, U.S. patent application Ser. No. 539,657, filed by Boaz Eitan on Jun. 13, 1990 for EPROM VIRTUAL GROUND ARRAY, which application is assigned to Wafer Scale Integration, Inc., teaches a new contactless EPROM cell array and its associated process flow. The contactless concept disclosed in the Eitan application is very attractive because it allows high density EPROMs to be fabricated without using aggressive technologies and design rules. The basic idea of the Eitan disclosure is the use of a "cross-point" EPROM cell, i.e. a cell which is defined by the crossing of perpendicular poly 1 and poly 2 lines in a virtual ground array. In order to avoid drain turn on, i.e. leaky non-selected cells on the same bit line during programming, and true virtual source decoding, metal contacts silicon every two bit lines and the non-contacted bit lines are connected to the Vss or Vcc lines via an access transistor. FIGS. 2 and 3 show an array layout and the equivalent circuit, respectively, for the Eitan cell.

However, there are several problems and disadvantages associated with the Eitan process flow. First, five layers of processing are required over the poly 1 layer: oxide/nitride/oxide/poly cap/nitride. The poly 1 and the five overlying layers are defined twice, once at poly 1 mask and once at poly 1 island mask. These two etching steps are very critical because they define, respectively, the length and width of the EPROM cell. Etching more layers in this way presents more difficulties in critical dimension control. Also, failing to remove any one of the five layers presents the risk of poly 1 stringers along the edges of the field oxide. These edges are located in the neighborhood of the access transistors, as well throughout the array.

Because the poly 2 in the Eitan structure is not self-aligned with the poly 1, a special "array field implant" is required in order to avoid leakages between adjacent bit lines. These leakages occur when poly 2 is misaligned with poly 1. The poly 2 controls one part of the silicon and leads to a parasitic poly 2 transistor between adjacent bit lines. For this reason, a high threshold voltage is required to avoid the turn on of this parasitic poly 2 transistor. This is done using an array boron field implant.

In addition to the implant, the Eitan process calls for an "isolation oxide" to move the field threshold to a sufficiently high voltage. This field implant leads to boron lateral diffusion into the channel of the cell, leading to channel width reduction, high bit line loading and reduction of the bit line to substrate breakdown voltage.

Additionally, the poly 2 etch is very critical in the Eitan process. The poly 2 etching terminates on a poly cap. In order to maintain the coupling ratio, it is necessary to stop the etch within a nominal poly cap thickness. This is difficult from the point of view of overetched latitude with a thin poly cap layer. Depending on the thickness of the isolation oxide, poly 1 to poly 2 misalignment will affect the parasitic capacitance of the word lines.

Furthermore, removing the top nitride before poly 2 deposit may affect the quality of the oxides all around the poly 1 floating gate. This could affect program disturb and data retention.

SUMMARY OF THE INVENTION

The present invention uses a stacked etch, i.e. edges of the poly 1 floating gate parallel to the poly 2 word line are self-aligned to the word line. This eliminates the parasitio poly 2 transistor and all steps required to cope with the problems associated with it (namely, special boron array field implant and isolation oxide). Furthermore, the process of the present invention does not use a poly cap and nitride layer. This eliminates all the problems related to the over etched latitude in the Eitan process and the potential problems related to nitride removal.

A better understanding of the features and advantages of the present invention will be obtained by reference to the following detailed description of the invention and accompanying drawings which set forth an illustrated embodiment in which the principles of the invention are utilized.

DESCRIPTION OF THE DRAWINGS

FIG. 4–7c/c' illustrate sequentially a first EPROM array fabrication process flow in accordance with the present invention;

FIGS. 8–12c/c' illustrate sequentially a second EPROM array fabrication process in accordance with the present invention.

DETAILED DESCRIPTION OF THE INVENTION

A process methodology will now be described for the stacked etch fabrication of an EPROM array that utilizes cross-point cells with an internal access transistor. The process flow will be presented in two parts. The first part describes a flow wherein the gate oxide of the access transistors is the same physical oxide as the oxide used in the array periphery, i.e., out of the cell array. This flow will be referred to hereinbelow as Scenario 1. The second flow, which will be referred to hereinbelow as Scenario 2, utilizes an access transistor gate oxide that is identical to the floating gate oxide.

As will be described below, both Scenario 1 and Scenario 2 have advantages and disadvantages when compared to one another. The object of the following discussion is not to assess which of Scenarios 1 and 2 is preferred, but to provide an extended stacked etch process flow for a cross-point of cell layout.

Each of Scenarios 1 and 2 is presented below at sequential steps of the corresponding cell process flow with cross-sectional drawings. Each figure includes a plan view of the structure at that stage of the process flow and the following three cross-sectional views in the structure: (1) in the word line direction in the EPROM cell array (designated "A/A"), (2) in the poly 1 direction perpendicular to the word line in both the EPROM cell and the access transistor array (designated "B/B"), and (3) in the word line direction in the access transistor area (designated "C/C").

SCENARIO 1

The process flow for Scenario 1 will be, described in conjunction with FIGS. 4–7c/c'.

The Scenario 1 process flow begins with conventional steps. First a 200 Å floating gate oxide is formed on a P-type silicon substrate. Next a layer of polysilicon (poly 1) is deposited to a thickness of about 1500 Å and doped with phosphorus at dose of $2$–$5 \times 10^{15}$ at low implant energy.

Next, as can be seen from FIG. 4, only three layers are formed on top of the poly 1: oxide/nitride/oxide, commonly called ONO. After growing these three layers, a photoresist mask is used to define vertical strips of poly 1 which are then plasma etched to form parallel vertical lines of ONO/poly 1.

Figure 1A:
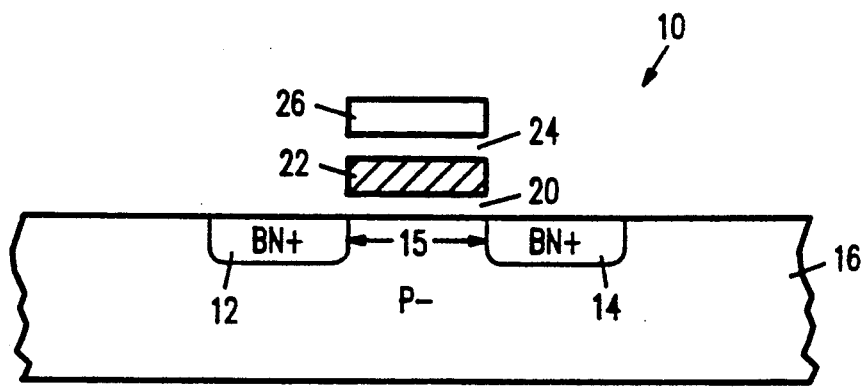
FIG. 1A is a cross-sectional view illustrating a conventional stacked etch EPROM cell.
Figure 1B:
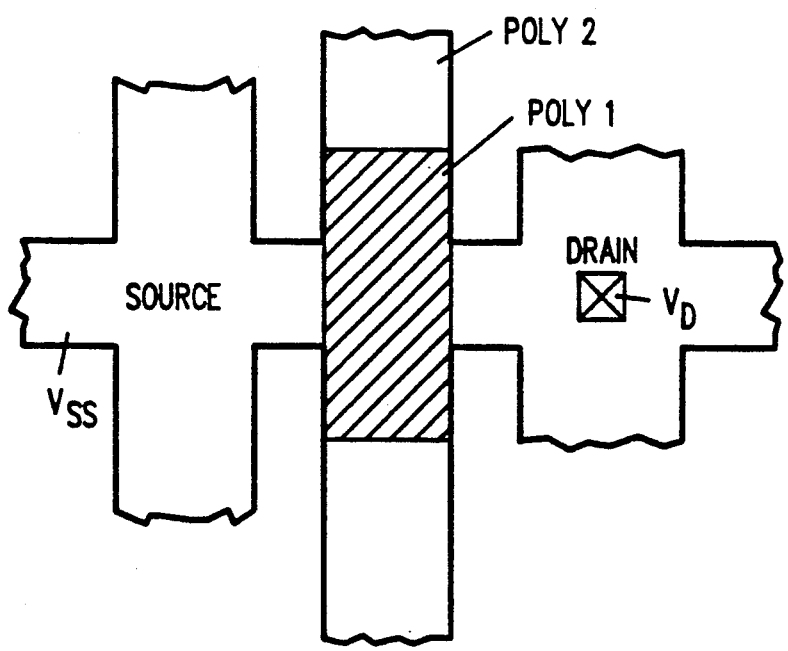
FIG. 1B is a plan view illustrating the layout of a conventional T-shaped stacked etch EPROM cell.
Figure 2:
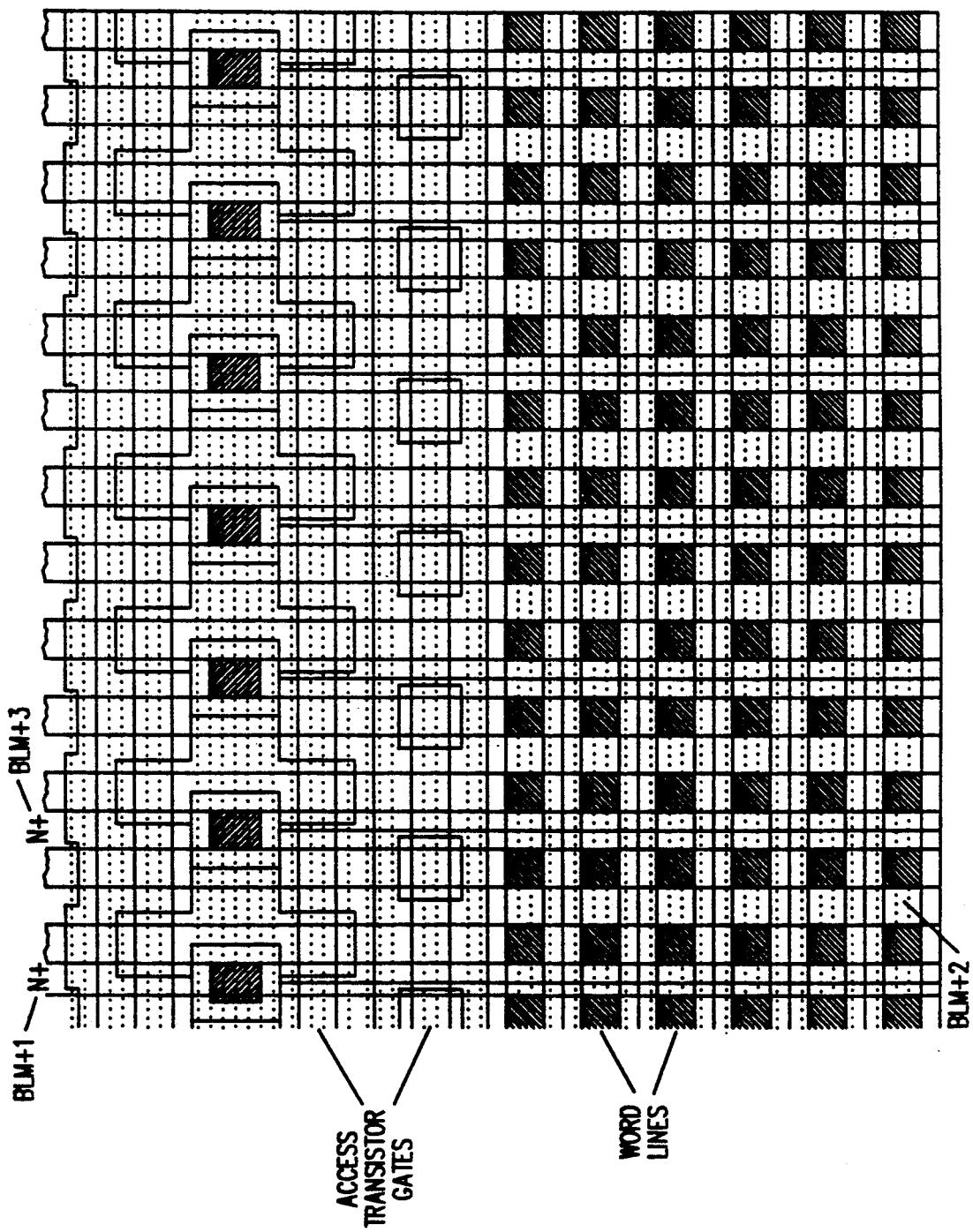
FIG. 2 is a layout illustrating a portion of a prior art contactless EPROM cell array.
Figure 3:
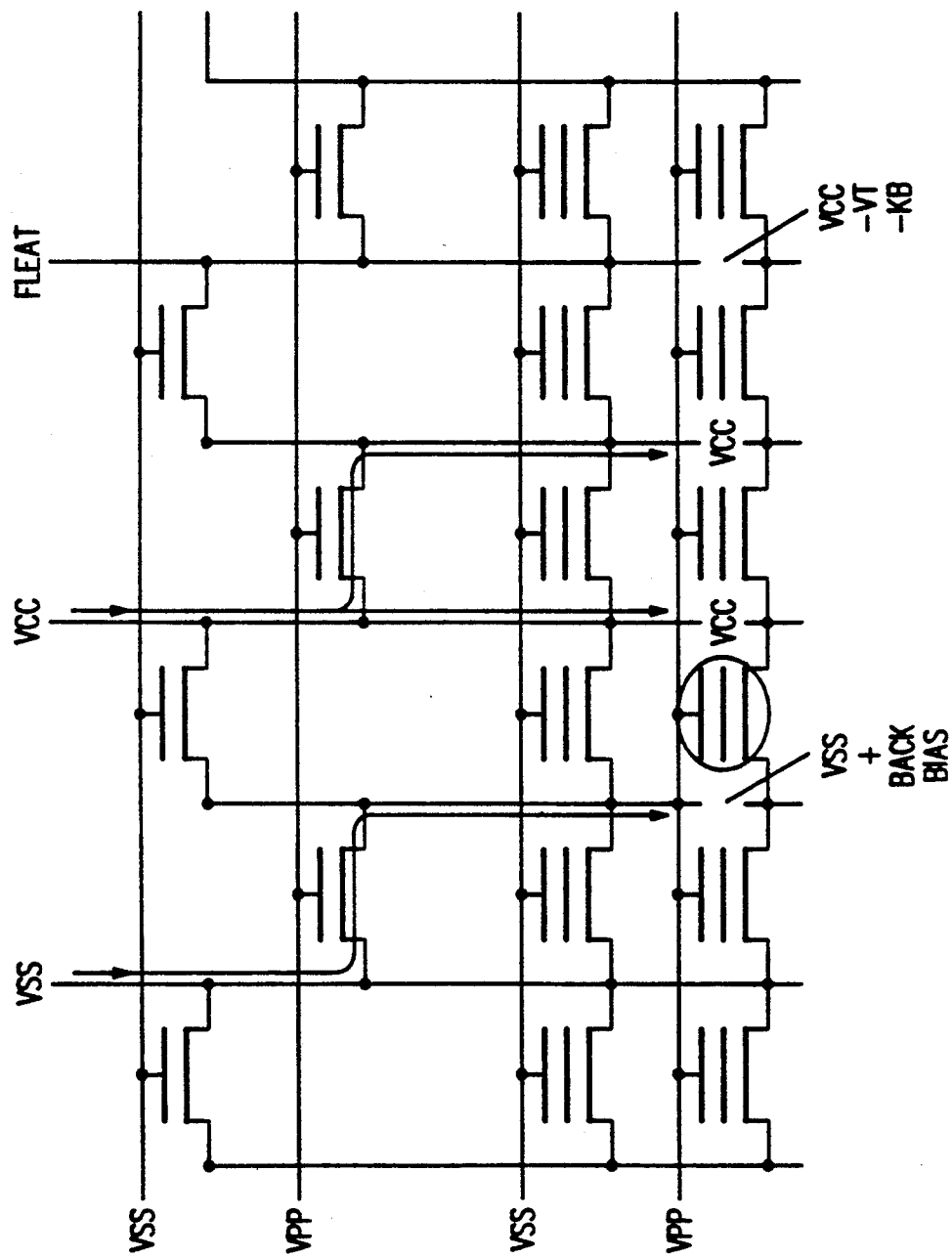
FIG. 3 is a schematic diagram illustrating an equivalent circuit for the FIG. 2 layout.
Figure 5:
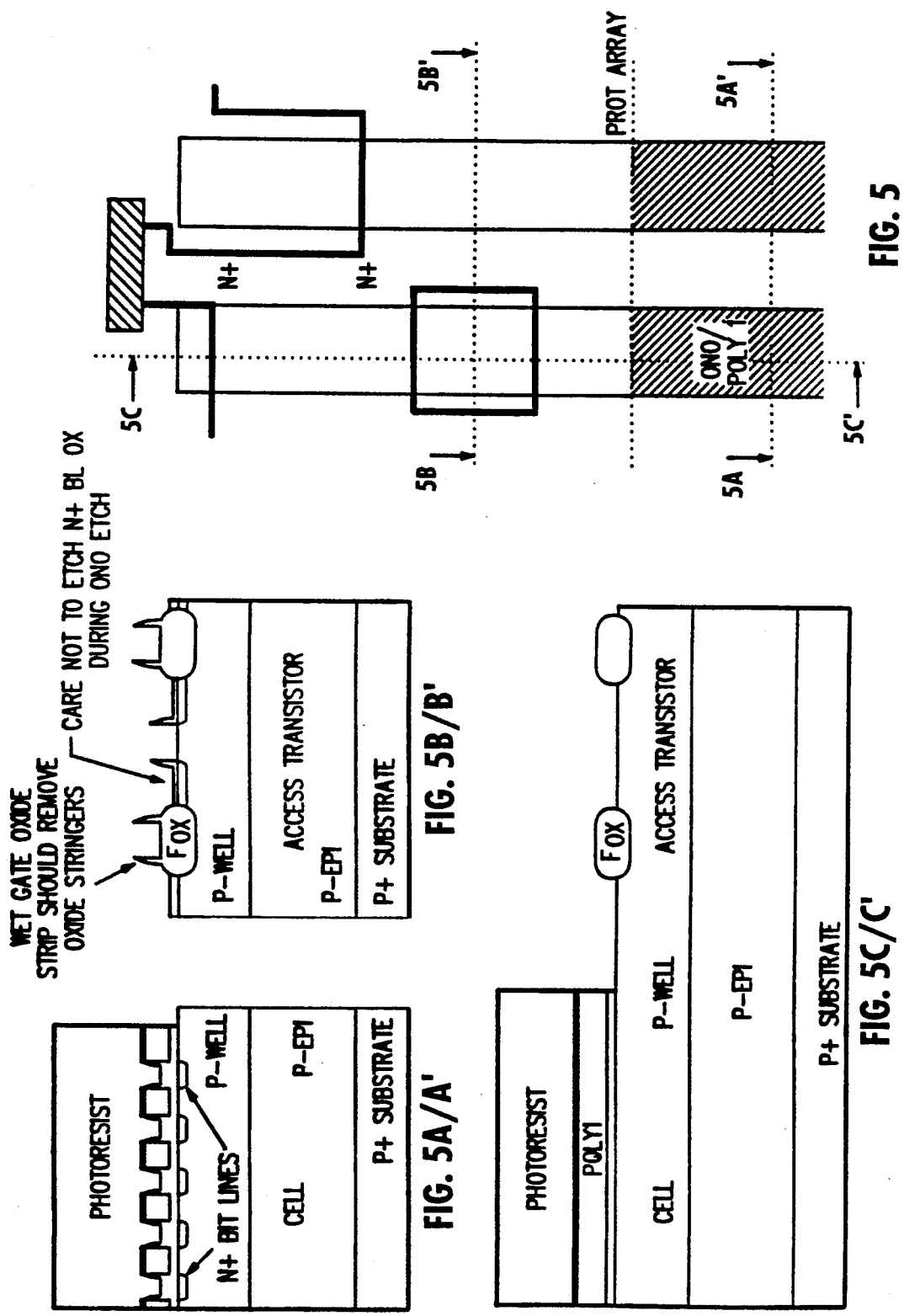

Referring to FIG. 5, after stripping the photoresist from the poly 1 mask, a thin edge oxide is grown between the poly 1 lines. The poly 1 lines are then used in a self-aligned to arsenic implant to define the N+ bit lines. Next, a "differential" oxide is grown over the N+ bit line areas to give substantial latitude to the further ONO and/or poly plasma etched steps. If, for example, a poly plasma etch is performed without formation of the differential oxide, then this step may lead to the digging of silicon in the exposed N+ bit line areas. For this reason, the differential oxide contributes to the equivalent oxide loss during ONO etch and is, hence, called differential oxide.

Next, a mask step called a protect array is performed. This mask has two goals: First, to etch away, out of the array, the ONO/poly layer (the poly 1 mask is a dark field mask) leaving ONO/poly 1 out of the array. This avoids the use of an extra mask to protect the periphery at the N+ bit line arsenic implant. In the flow of Scenario 1 process, the arsenic implant is performed on the full wafer with no mask. Second, it removes the ONO/- poly 1 vertical lines in the regions of the access transistors.

Next, the ONO/poly 1 layers are plasma etched and the underlying floating gate oxide is etched off in wet chemistry utilizing diluted HF. Then, the photoresist is stripped.

In FIG. 5, the layout presents the different layers at the end. As illustrated, no more ONO/poly 1 is present on the upper side of the protect mask. On the lower side of the protect mask, ONO/poly 1 vertical lines are still present to further provide the floating gates of the EPROM cells.

Referring now to FIG. 6, the next step in the Scenario 1 process involves the growth of 200 Å gate oxide 2 in regions of the access transistor gates and everywhere in the gate channel regions out of the array. A threshold voltage mask (VTP mask) is then performed and P channel regions are boron implanted to provide the right threshold voltage. After VTP mask photoresist strip, a second layer of 2000 Å polysilicon (poly 2) is deposited and doped with phosphorous. Then, a 2500 Å tungsten silicide layer is deposited and a poly 2 mask is performed. The poly 2 mask has three functions: defining the gates of the transistors in the periphery, defining the gates of the access transistors in the array, and defining the word lines of the EPROM cells. Next, the tungsten silicide layer and the poly 2 layer are plasma etched.

Figure 7:
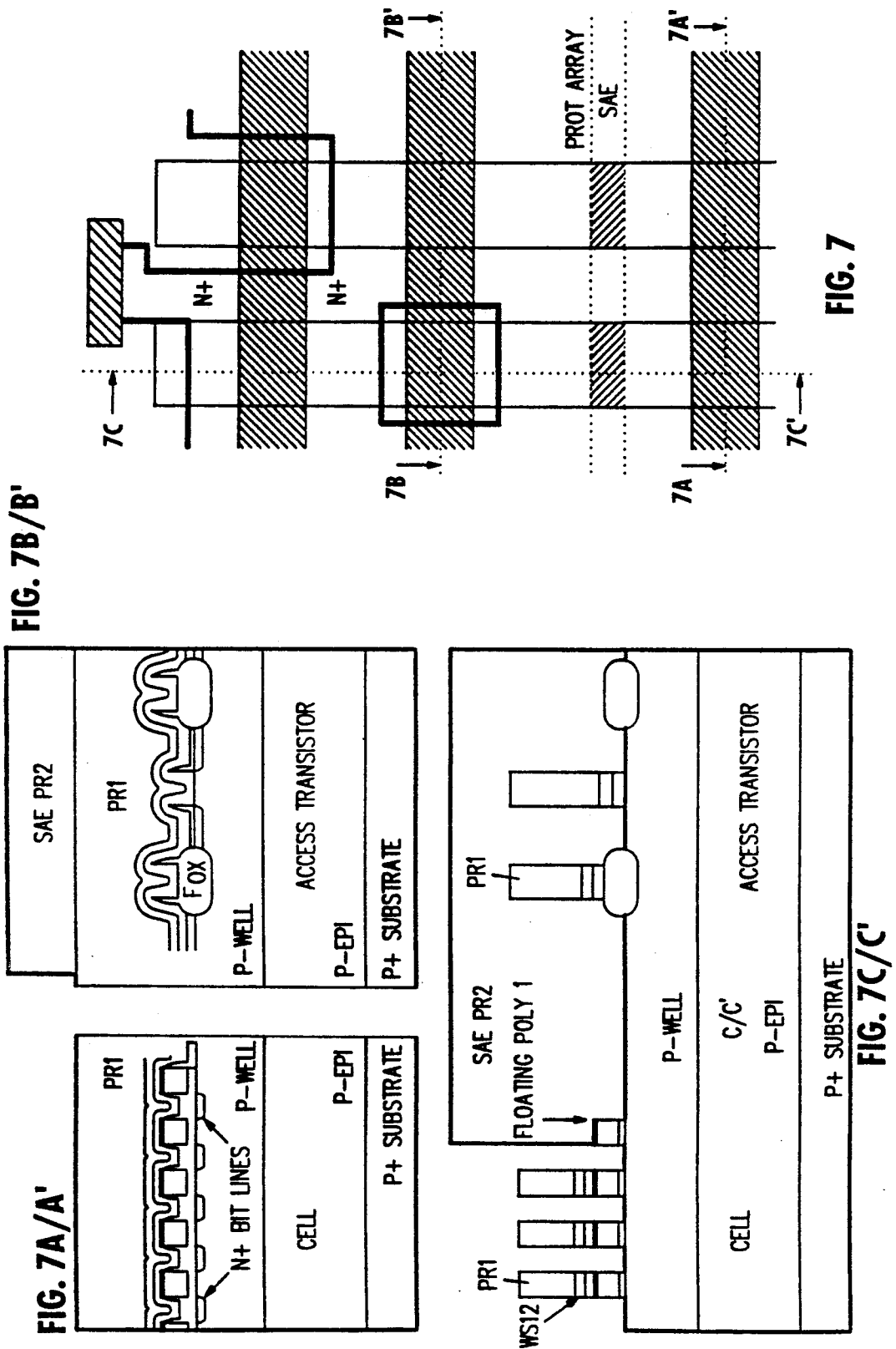

Referring to FIG. 7, after this plasma etch, the photoresist is not stripped. A second photoresist is spun on and a new masking step is performed. This new mask is called self-aligned etch (SAE) and has two functions. First, it maintains the integrity of the photoresist of the proceeding poly 2 mask in order to allow self-aligned etch to poly 2 of residual ONO/poly 1 layer between the lines in the EPROM cell array. This etch ends the construction of the EPROM cell. Second, it protects the periphery in the access transistors during the SAE etch.

Particular note is made at this state that, as shown in FIG. 6, in FIG. 7, the SAE mask is intentionally lower than the protect array mask. This is to avoid digging the silicon over the N+ bit lines and, mainly, between adjacent N+ bit lines. This leads to the formation of poly 1 floating gates at the overlap between the protect array and the SAE masks. Since this floating poly can lead to leakages between adjacent bit lines during the programming of the cells, a special implant mask and boron implant is performed at the beginning of the process in those areas (i.e. at protect array/SAE overlap) in order to increase the threshold voltage of these parasitic floating poly 1 devices and at the same time suppressing the parasitic leakage.

It is also noted that digging of silicon between adjacent N+ bit lines at the region between the protect array and SAE masks (if they don't overlap intentionally) may be acceptable as long as the quality of the N+ bit line/P- junction is not degraded in terms of leakage. If there is no impact on junction leakage, then overlap between the SAE and the protect array masks is not required anymore and the special implant boron mask at the beginning of the process is not required since parasitic floating gates doesn't exist.

SCENARIO 2

The process flow for Scenario 2 is illustrated in FIGS. 8-12c/c'.

The initial steps of the Scenario 2 flow are the same as in Scenario 1 to formation of the poly 1.

Referring to FIG. 8, as in FIG. 4, again, only three layers are formed on top of the poly 1: oxide/nitride/oxide (ONO). After growing these three layers, the poly i mask defines vertical strips of poly 1 which are plasma etched, leading to parallel vertical lines of ONO/poly 1.

As shown in FIG. 9, after stripping the photoresist from the poly 1 mask, an edge oxide is grown between the poly 1 lines and then a self-aligned to poly 1 arsenic implant is performed, defining the N+ bit line. Then, a thin "differential oxide" (500–800 Å) is grown over the N+ bit line areas to give substantial latitude to further ONO and/or poly plasma etch steps.

As will be described in greater detail below, Scenario 2 involves only the SAE etch (compared to Scenario 1, which involve both the Protect Array and SAE etch in areas of the access transistors). For this reason, a thinner differential oxide is permitted in the Scenario 2 flow.

Next, the protect array mask is performed. This mask has the same function as the protect array mask in Scenario 1, except for one point: the regions of the access transistors are now protected. The ONO/poly 1 layers are then plasma etched and the underlying floating gate oxide is etched off in wet chemistry, for example diluted HF. Then the photoresist is stripped.

As shown in FIG. 9, after the protect array etch, the parallel vertical lines of poly 1 still remain in the access transistor areas.

Referring now to FIG. 10, the gate oxide 2 is grown everywhere in the gate regions out of the array. Then a thin poly layer (200 Å) is deposited. This poly layer is optional; the function of this layer is avoid spinning on photoresist on the peripheral gate oxide for the further described threshold voltage and access transistor gate masks (photoresist on gate oxide may lead to contamination issues).

Next, the VTP threshold voltage mask is performed and P-channel regions are boron implanted to provide the right threshold voltage. After a photoresist strip, a new masking step is performed: access transistor gate mask. The function of this mask is to open the photoresist only over regions of the access transistors in order to remove by plasma etch the thin poly layer and the underlying ONO.

As shown in FIG. 10, the layout presents the different layers at the end: on the upper side of the access transistor gate mask there is no more ONO over poly 1 lines. This allows short circuiting with the poly 1 the further deposited poly 2. On the lower side of the mask, thin poly/ONO/poly 1 vertical lines are still present to further provide the floating gates of the EPROM cells.

Referring now to FIG. 11, in the next step, 2000 Å poly 2 is deposited and doped. Then a 2500Å tungsten silicide layer is deposited and the poly 2 mask is performed. This mask has three functions: defining the gate of the transistor in the periphery, defining the gate of the access transistor in the array, and defining the word lines of the EPROM cells. Then the silicide/poly 2 layers are plasma etched.

Compared to Scenario 1, the access transistor gate is no longer poly 2, but poly 1, i.e., the gate oxide is floating gate oxide.

Referring now to FIG. 12, after this plasma etch, the photoresist is not stripped. A second photoresist is spun on and a new masking step is performed. This new mask called self-aligned etch (SAE) has two functions. First, it protects the photoresist of the proceeding poly 2 mask in order to allow self-aligned etch to poly 2 of a residual ONO/poly 1 layers between the word lines in the EPROM cell areas. This etch ends the construction of the EPROM cell. Second, it protects the periphery areas during SAE etch.

Compared to Scenario 1, the access transistor areas are not protected by SAE, because ONO/poly 1 has to be removed in these areas. An important issue to note is not to etch the poly 1 at the end of the first silicide/poly 2/thin poly etch. Otherwise, the poly 1 may be etched away in the access transistor areas before the end of etching the poly 1 in the EPROM cell at the SAE etch, leading to some digging of silicon in these areas.

As a general comparison of Scenarios 1 and 2 as described above, Scenario 2 has the following advantages. First, the parasitic poly 1 floating gates crossing the SAE/protect array don't exist anymore. It is noted that the special mask at the beginning of the process in Scenario 1 is also no longer required. Second, this mask is replaced by an access transistor gate mask which allows the contact from poly 2 to poly 1 over the access transistor gate areas. Third, since the protect array etch is not performed over the access transistor areas, the thickness of differential oxide may be relaxed. Even more, this will help at the same time to decrease the N+ bit line lateral diffusion. Fourth, no more lift off is required.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A method of fabricating a cross-point EPROM array in a silicon substrate of P-type conductivity, the array including a cell array area and a peripheral area, the method comprising:
   (a) forming a layer of first insulating material on the silicon substrate;
   (b) forming a first layer of polysilicon (poly 1) on the layer of insulating material;
   (c) forming a layer of second insulating material on the first layer of polysilicon;
   (d) forming a poly 1 mask to define parallel lines of the second insulating material and underlying first layer of polysilicon;
   (e) etching exposed portions of the second insulating material and underlying first layer of polysilicon to define parallel vertical strips of second insulating material and poly 1;
   (f) after removing the poly 1 mask, forming N+ regions in the silicon substrate between the parallel vertical strips of second insulating material and poly 1;
   (g) performing a differential oxidation step to form additional oxide on the second insulating material of the vertical strips while simultaneously forming oxide over the N+ regions;
   (h) forming a protect array mask for protecting the cell array area;
   (i) removing the second insulating material, and underlying poly 1 and first insulating material from the peripheral area;
   (j) after removing the protect array mask, forming gate oxide regions in the peripheral area;
   (k) forming a second layer of polysilicon (poly 2) over the structure formed in steps (a)-(j) above;
   (l) forming a layer of conductive material over the second layer of polysilicon;
   (m) forming a poly 2 mask on the layer of conductive material to define parallel lines of poly 2 that run perpendicular to the poly vertical strips;
   (n) etching the conductive material and the underlying poly 2 to define poly 2 word lines running perpendicular to the poly 1 strips but separated therefrom by the second insulating material.
   (o) forming a self aligned etch mask over the poly 2 mask in the peripheral area;
   (p) utilizing the poly 2 word lines in a stacked etch step to define the poly 1 floating gates at the cross-point EPROM cells of the array.

2. A method as in claim 1 wherein the first insulating material is silicon dioxide.

3. A method as in claim 2 wherein the second insulating material is a composite layer of oxide-nitride-oxide.

4. A method as in claim 3 wherein the conductive material is tungsten silicide.

5. A method as in claim 1 wherein steps (a)-(p) in claim 1 are preceded by the following steps:
   (a) forming a special mark to define exposed interface regions in the silicon substrate at the interface between the cell array area and the peripheral area; and
   (b) introducing N-type dopant into the exposed interface regions in the silicon substrate.

6. A method of fabricating a cross-point EPROM array in a silicon substrate of P-type conductivity, the EPROM array including a cell array area that includes a cell matrix comprising rows and columns of EPROM cells, the EPROM array further including a peripheral area that includes an access transistor area that includes access transistors, the EPROM cell columns being accessible via the access transistors the method comprising:
   (a) forming a layer of first insulating material on the silicon substrate;
   (b) forming a first layer of polysilicon (poly1) on the layer of insulating material;
   (c) forming a layer of second insulating material on the first layer of polysilicon;
   (d) forming a poly1 mask to define parallel lines of the second insulating material and underlying first layer of polysilicon;
   (e) etching exposed portions of the second insulating material and underlying first layer of polysilicon to define parallel vertical strips of second insulating material and poly1;
   (f) after removing the poly1 mask, forming N+ regions in the silicon substrate between the parallel vertical strips of second insulating material and poly1;
   (g) performing a differential oxidation step of form additional oxide on the second insulating material of the vertical strips while simultaneously forming oxide over the N+ region;
   (h) forming a protect array mask for protecting both the cell array area and the access transistor area of the peripheral area, the defining an unprotected area of the peripheral area;
   (i) removing the second insulating material, and underlying poly1 and first insulating material from the unprotected area of the peripheral area;

(j) after removing the protect array mask, such that parallel vertical lines of poly1 still remain in the access transistor area, forming ate oxide regions in the peripheral area;

(k) forming a thin layer of polysilicon over the structure formed in steps (a)–(j) above;

(l) defining an access transistor gate mask to expose the access transistor area;

(m) removing the second insulating material and thin polysilicon layer from the access transistor area;

(n) forming a second layer of polysilicon (poly2) over the structure formal in steps (a)–(m) above;

(o) forming a layer of conductive material over the second layer of polysilicon;

(p) forming a poly2 mask on the layer of conductive material to define parallel lines of poly that non perpendicular to the poly1 vertical strips;

(q) etching the conductive material and the underlying poly2 to define poly2 and lines running perpendicular to the poly1 strips but separated therefrom by the second insulating material;

(r) forming a self-aligned etch mask over the poly2 mask in the peripheral area; and (s) utilizing the poly2 wordlines in a stacked etch step to define the poly1 floating gates at the cross-point EPROM cells of the array.

7. A method as in claim 6 wherein the first insulating material is silicon dioxide.

8. A method as in claim 7 wherein the second insulating material is a composite layer of oxide-nitride-oxide.

9. A method as in claim 8 wherein the conductive material is tungsten silicide.

10. A method as in claim 6 wherein the thin polysilicon layer is about 200 Å thick.

* * * * *

UNITED STATES PATENT AND TRADEMARK OFFICE
CERTIFICATE OF CORRECTION

PATENT NO. : 5,240,870

DATED : AUGUST 31, 1993

INVENTOR(S): Albert M. Bergemont

It is certified that error appears in the above - identified patent and that said Letters Patent is hereby corrected as shown below:

On the Front Page, under "Related U.S. Application Data", at [63] delete "Continuation of Ser. No. 799,762, Apr. 13, 1992" and replace with --Continuation of Ser. No. 799,762, Nov. 27, 1991--.

In Col. 8, line 47, delete "polyl" and replace with --poly 1--.

In Col. 8, line 53, delete "polyl" and replace with --poly 1--.

In Col. 8, line 54, delete "polyl" and replace with --poly 1--.

In Col. 8, line 57, delete "polyl" and replace with --poly 1--.

In Col. 8, line 58, delete "of" and replace with --to--.

In Col. 8, line 67, delete "polyl" and replace with --poly 1--.

In Col. 9, line 2, delete "polyl" and replace with --poly 1--.

In Col. 9, line 3, delete "ate" and replace with --gate--.

In Col. 9, line 17, delete "poly that non" and replace with --poly 2 that are--.

UNITED STATES PATENT AND TRADEMARK OFFICE
CERTIFICATE OF CORRECTION

PATENT NO. : 5,240,870

DATED : AUGUST 31, 1993

INVENTOR(S) : Albert M. Bergemont

It is certified that error appears in the above - identified patent and that said Letters Patent is hereby corrected as shown below:

In Col. 9, line 18, delete "polyl" and replace with --poly 1--.

In Col. 10, line 3, delete "polyl" and replace with --poly 1--.

In Col. 10, line 8, delete "polyl" and replace with -- poly 1--.

Signed and Sealed this

Twenty-ninth Day of March, 1994

Attest:

BRUCE LEHMAN

*Attesting Officer*     *Commissioner of Patents and Trademarks*